US008842405B2

(12) United States Patent
Miura et al.

(10) Patent No.: US 8,842,405 B2
(45) Date of Patent: *Sep. 23, 2014

(54) ELECTRONIC DEVICE

(75) Inventors: Ryotaro Miura, Aichi-ken (JP);
Yasunari Tanimura, Takahamai (JP);
Noriyuki Takagi, Anjo (JP)

(73) Assignee: Denso Corporation, Kariya (JP)

( * ) Notice: Subject to any disclaimer, the term of this patent is extended or adjusted under 35 U.S.C. 154(b) by 370 days.

This patent is subject to a terminal disclaimer.

(21) Appl. No.: 13/239,749

(22) Filed: Sep. 22, 2011

(65) Prior Publication Data

US 2012/0075761 A1 Mar. 29, 2012

(30) Foreign Application Priority Data

Sep. 24, 2010 (JP) ................................. 2010-214148

(51) Int. Cl.
*H02H 7/00* (2006.01)
*H02M 1/32* (2007.01)
*H03K 17/082* (2006.01)
*H02M 7/5387* (2007.01)

(52) U.S. Cl.
CPC ............ *H02M 1/32* (2013.01); *H02M 7/53871* (2013.01); *H03K 17/0828* (2013.01)
USPC ...................................................... 361/93.1

(58) Field of Classification Search
USPC ....................................................... 361/93.1
See application file for complete search history.

(56) References Cited

U.S. PATENT DOCUMENTS

| 5,091,664 A | 2/1992 | Furuhata |
| 8,497,728 B2 * | 7/2013 | Mizobe et al. ................ 327/427 |
| 2005/0099751 A1 | 5/2005 | Kumagai |
| 2012/0075753 A1 * | 3/2012 | Watanabe et al. ............... 361/18 |

FOREIGN PATENT DOCUMENTS

| JP | 2-266712 | 10/1990 |
| JP | 3430878 | 5/2003 |
| JP | 2005-151631 | 6/2005 |
| JP | P2006-050865 A | 2/2006 |
| JP | P2008-141612 A | 6/2008 |
| JP | 2009-290287 | 12/2009 |
| JP | 2010-75007 | 4/2010 |
| JP | 2010-154595 | 7/2010 |

OTHER PUBLICATIONS

Office Action (2 pages) dated Dec. 12, 2012 issued in corresponding Japanese Application No. 2010-214148 and English translation (2 pages).

(Continued)

*Primary Examiner* — Stephen W Jackson
(74) *Attorney, Agent, or Firm* — Nixon & Vanderhye PC

(57) ABSTRACT

An electronic device that is capable of detecting an abnormal state such that a switching element is unable to be turned off in spite of a drive signal instructing turn-off of the switching element. The device includes a switching element that is driven by controlling a voltage on its control terminal, a drive circuit that controls the voltage on the control terminal of the switching element on the basis on an inputted drive signal to drive the switching element. In cases where there exists a current flowing through the switching element in spite of the drive signal instructing turn-off of the switching element, the drive circuit determines that the switching element is in an abnormal state, and cuts off supply of voltage from a drive power supply circuit to the control terminal of the switching element to thereby turn off the switching element.

20 Claims, 5 Drawing Sheets

(56) References Cited

OTHER PUBLICATIONS

Japanese Office Action dated Sep. 4, 2012, issued in corresponding Japanese Application No. 2010-214148, with English translation.

Office Action (2 pages) dated Mar. 18, 2014, issued in corresponding Japanese Application No. 2013-042934 and English translation (2 pages).

* cited by examiner

ELECTRONIC DEVICE

CROSS-REFERENCE TO RELATED APPLICATION

This application is based on and claims the benefit of priority from earlier Japanese Patent Application No. 2010-214148 filed Sep. 24, 2010, the description of which is incorporated herein by reference.

BACKGROUND

1. Technical Field

This invention relates to an electronic device that includes a switching element and a drive circuit.

2. Related Art

There is known as an electronic device including a switching element and a drive circuit a power converter as disclosed in Japanese Patent No. 3430878.

The disclosed power converter includes an insulated gate bipolar transistor (IGBT), three metal-oxide-semiconductor field-effect transistors (MOSFETs), and a control circuit. A source terminal, a drain terminal, a gate terminal of a first MOSFET are electrically connected to a power supply for the drive circuit, a gate terminal of the IGBT, and the control circuit, respectively. A source terminal, a drain terminal, and a gate terminal of each of second and third MOSFETs are electrically connected to an emitter terminal of the IGBT, a gate terminal of the IGBT, and the control circuit, respectively.

The control circuit controls the three MOSFETs on the basis of a drive signal inputted from the external to drive the IGBT. When the drive signal instructs the control circuit to turn on the IGBT, the control circuit turns on the first MOSFET and turns off the second MOSFET, thereby charging the gate of the IGBT through the power supply for the drive circuit. Accordingly, a voltage on the gate (referred to as a gate voltage in the following) is increased higher than a turn-on/off threshold for turning on and off the IGBT, which leads to turn-on of the IGBT.

On the other hand, when the drive signal instructs the control circuit to turn off the IGBT, the control circuit turns off the first MOSFET and turns on the second MOSFET, thereby discharging the gate of the IGBT. Accordingly, the gate voltage is decreased lower than the turn-on/off threshold, which leads to turn-off of the IGBT. When the gate voltage is further decreased lower than a predetermined value, the control circuit turns on the third MOSFET. This leads to further discharge from the gate of the IGBT, which allows the IGBT to be kept in an off-state.

In the above disclosed power converter, in the presence of a fault in the IGBT and/or MOSFETs, it is likely that an abnormal state will occur such that the control circuit is unable to turn off the IGBT in spite of the drive signal instructing the control circuit to turn off the IGBT. This is because the gate voltage doesn't become lower than the turn-on/off threshold due to the fault. Continuation of such an abnormal state may lead to heat generation in the IGBT, which in turn may lead to thermal destruction of the device.

In consideration of the foregoing, exemplary embodiments of the present invention are directed to providing an electronic device that is capable of detecting an abnormal state such that a switching element is unable to be turned off in spite of a drive signal instructing turn-off of the switching element.

SUMMARY

In accordance with an exemplary aspect of the present invention, there is provided an electronic device comprising, a first switching element that is driven by controlling a voltage on its control terminal; a first drive circuit that controls the voltage on the control terminal of the first switching element on the basis on an inputted drive signal to drive the first switching element. In the electronic device of the present aspect, in cases where there exists a current flowing through the first switching element in spite of the drive signal instructing turn-off of the first switching element, the first drive circuit determines that the first switching element is in an abnormal state.

With this configuration, it is possible to detect an abnormal state such that the first switching element is unable to be turned off in spite of the drive signal instructing turn-off of the first switching element.

DESCRIPTION OF SPECIFIC EMBODIMENTS

The present invention will be described more fully hereinafter with reference to the accompanying drawings. Like numbers refer to like elements throughout.

The present invention will here be applied to a motor control device mounted in a vehicle that controls a vehicle drive motor.

First Embodiment

Figure 1:
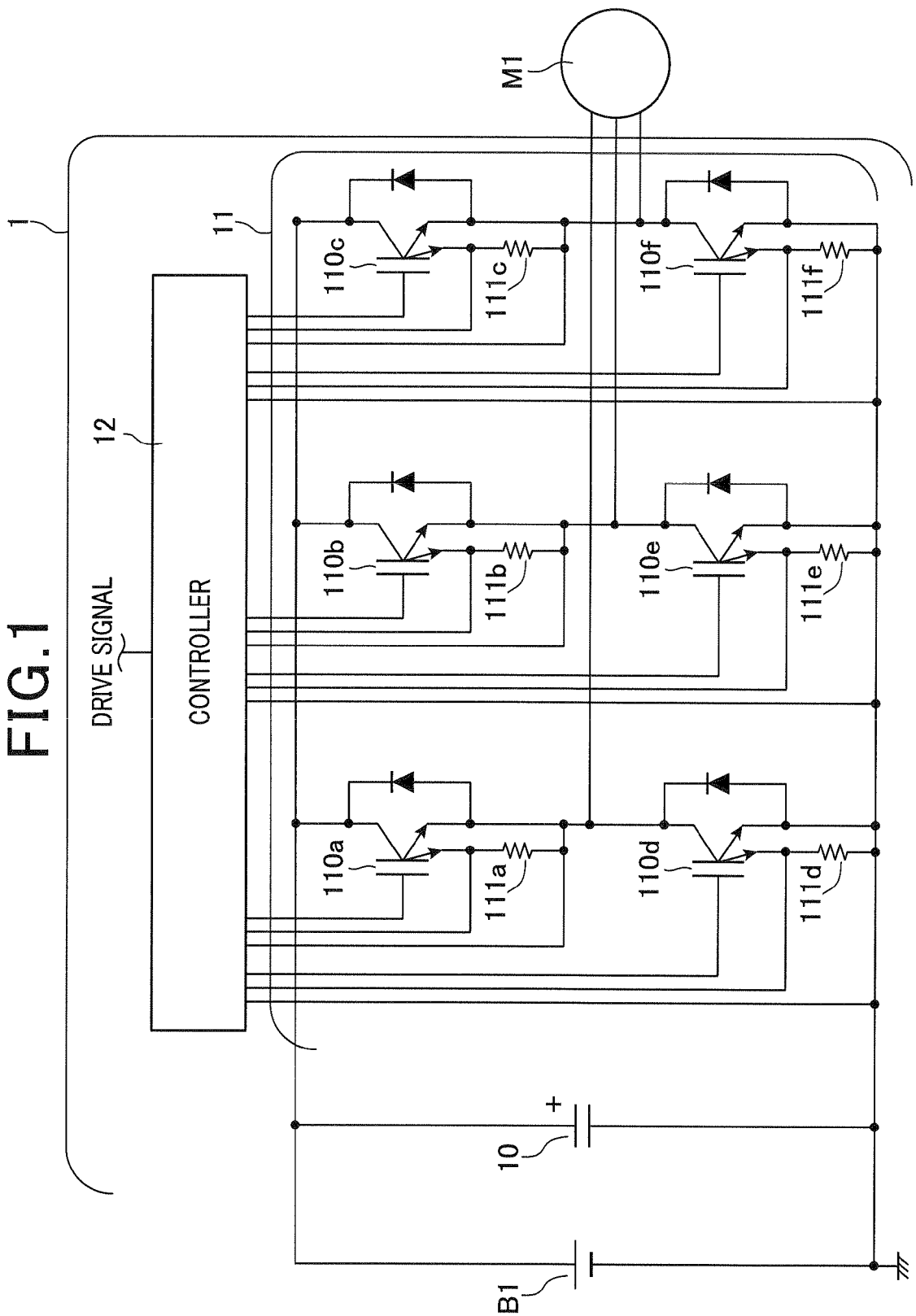
FIG. 1 schematically illustrates a circuit diagram of a motor control device in accordance with a first embodiment of the present embodiment.

FIG. 1 shows a circuit diagram of a motor control device as an electronic device in accordance with a first embodiment of the present invention.

The motor control device 1 converts a DC (direct current) high voltage (e.g., 288V) outputted from a high-voltage battery B1 that is electrically insulated from a vehicle body into a three-phase AC (alternate current) voltage, supplies the three-phase AC voltage to a vehicle drive motor M1, and thereby controls the vehicle drive motor M1. The motor control device 1 includes a smoothing capacitor 10, an inverter 11, and a controller 12.

The smoothing capacitor 10 is operative to smooth the DC high voltage of the high-voltage battery B1. One end of the smoothing capacitor 10 is electrically connected to a positive electrode terminal of the high-voltage battery B1, and the other end of the smoothing capacitor 10 is electrically connected to a negative electrode terminal of the high-voltage battery B1. The negative electrode terminal of the high-voltage battery B1 is grounded via a ground terminal for the high-voltage battery B1.

The inverter 11 converts the DC voltage smoothed by the smoothing capacitor 10 into the three-phase AC voltage, and supplies the three-phase AC voltage to the vehicle drive motor M1. The inverter 11 includes IGBT 110a-110f, and current sense resistors 111a-111f.

Each IGBT 110a-110f, which is a gate-controlled switching element, is driven by controlling a voltage on its gate (control terminal), and converts the DC voltage smoothed by the smoothing capacitor 10 into the three-phase AC voltage through turn-on and turn-off of the IGBT. Each IGBT 110a-110f includes a current sense terminal through which a current flows that is proportional to and smaller than a collector current of the IGBT. The IGBTs 110a, 110d are electrically connected in series where an emitter of the IGBT 110a is electrically connected to a collector of the IGBT 110d. The IGBTs 110b, 110e are electrically connected in series where an emitter of the IGBT 110b is electrically connected to a collector of the IGBT 110e. The IGBTs 110c, 110f are electrically connected in series where an emitter of the IGBT 110c is electrically connected to a collector of the IGBT 110f. Three pairs of the IGBTs, that is, the pair of the IGBTs 110a, 110d, the pair of the IGBTs 110b, 110e, and the pair of the IGBTs 110c, 110f, are electrically connected in parallel with each other where collectors of the respective IGBT 110a-110c are electrically connected to one end of the smoothing capacitor 10 and emitters of the respective IGBTs 110d-110f are electrically connected to the other end of the smoothing capacitor 10. In addition, the gate and emitter of each IGBT 110a-110f are electrically connected to the controller 12. A series-connection point of each pair of the three pairs of the IGBTs is electrically connected to the vehicle drive motor M1.

Each current sense resistor 111a-111f is operative to convert a current that flows through the corresponding IGBT 110a-110f, particularly, through the current sense terminal of the corresponding IGBT 110a-110f. One end of each current sense resistor 111a-111f is electrically connected to the current sense terminal of the corresponding IGBT 110a-110f, and the other end of the current sense resistor is electrically connected to the emitter of the corresponding IGBT 110a-110f. Both ends of each current sense resistor 111a-111f are electrically connected to the controller 12.

The controller 12 is responsible for controlling the IGBTs 110a-110f. The controller 12 is electrically connected to both the gate and emitter of each IGBT 110a-110f, and is further electrically connected to both ends of each current sense resistor 111a-111f to detect a current that flows through the corresponding IGBT 110a-110f.

Figure 2:
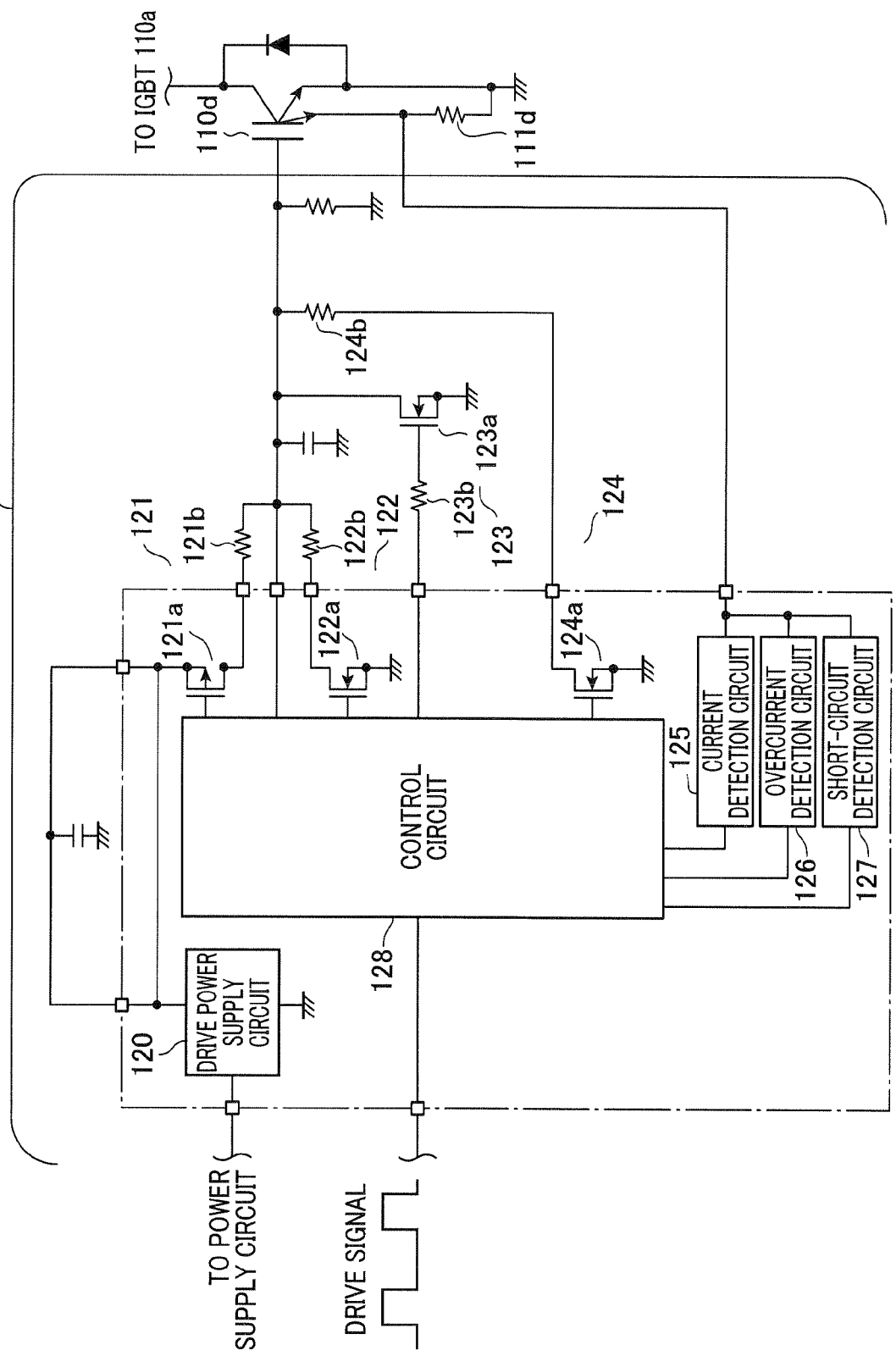
FIG. 2 schematically illustrates a circuit diagram of a controller of FIG. 1.
Figure 3:
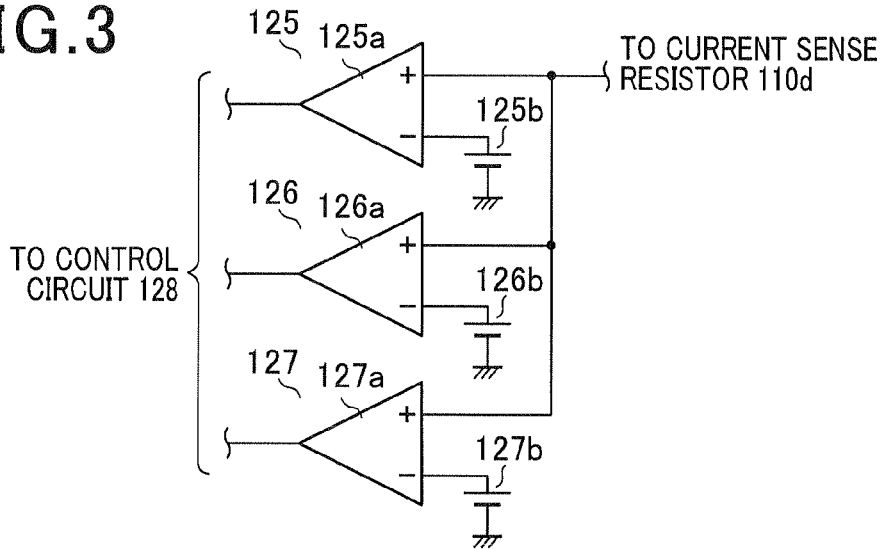
FIG. 3 schematically illustrates a circuit diagram of a current detection circuit, an overcurrent detection circuit and a short-circuit detection circuit of FIG. 2.

There will now be explained the controller in more detail with reference to FIG. 2 and FIG. 3. FIG. 2 shows a circuit diagram of the controller of FIG. 1, particularly, of a portion of the controller that pertains to one of the IGBTs, for example, the IGBT 110d. FIG. 3 shows a circuit diagram of a current detection circuit, an overcurrent detection circuit and a short-circuit detection circuit of FIG. 2.

As shown in FIG. 2, the controller 12 includes, for the IGBT 110d, a drive power supply circuit 120, a turn-on drive circuit 121, a turn-off drive circuit 122, an off-state holding circuit 123, a cut-off circuit 124, a current detection circuit 125, an overcurrent detection circuit 126, a short-circuit detection circuit 127, and a control circuit 128. The controller 12 further includes, for each of the other IGBTs 110a-110c, 110e, 110f, a corresponding drive power supply circuit, a corresponding turn-on drive circuit, a corresponding turn-off drive circuit, a corresponding off-state holding circuit, a corresponding cut-off circuit, a corresponding current detection circuit, a corresponding overcurrent detection circuit, a corresponding short-circuit detection circuit, a corresponding control circuit.

The drive power supply circuit 120 supplies a voltage for driving the IGBT 110d. The drive power supply circuit 120 stabilizes a voltage from a power supply circuit (not shown), outputs the stabilized voltage, and terminates its operation on the basis of an instruction from the control circuit 128. An input terminal of the drive power supply circuit 120 is electrically connected to the power supply circuit. A positive electrode terminal of the drive power supply circuit 120 is electrically connected to the turn-on drive circuit 121. A negative electrode terminal of the drive power supply circuit 120 is grounded via the ground terminal for the high-voltage battery, and is electrically connected to the emitter of the IGBT 110d via the ground terminal for the high-voltage battery. In addition, a control terminal of the drive power supply circuit 120 is electrically connected to the control circuit 128.

The turn-on drive circuit 121 is responsible for turning on the IGBT 110d. More specifically, the turn-on drive circuit 121 charges the gate of the IGBT 110d to increase a voltage on the gate (referred to as a gate voltage in the following) of the IGBT 110d beyond a turn-on/off threshold for turning on and off the IGBT 110d, thereby turning on the IGBT 110d. The turn-on drive circuit 121 includes a turn-on drive FET 121a and a turn-on drive resistor 121b.

The turn-on drive FET 121a, which is a P-channel MOSFET in the present embodiment, is turned on to charge the gate of the IGBT 110d. A source of the turn-on drive FET 121a is electrically connected to the positive electrode terminal of the drive power supply circuit 120. A drain of the turn-on drive FET 121a is electrically connected to the gate of the IGBT 110d via the turn-on drive resistor 121b. A gate of the turn-on drive FET 121a is electrically connected to the control circuit 128.

The turn-off drive circuit 122 is responsible for turning off the IGBT 110d. More specifically, the turn-off drive circuit 122 discharges the gate of the IGBT 110d to decrease the gate voltage of the IGBT 110d below the turn-on/off threshold for turning on and off the IGBT 110d, thereby turning off the IGBT 110d. The turn-off drive circuit 122 includes a turn-off drive FET 122a and a turn-off drive resistor 122b.

The turn-off drive FET 122a, which is an N-channel MOSFET in the present embodiment, is turned on to discharge the gate of the IGBT 110d. A source of the turn-off drive FET 122a is grounded via the ground terminal for the high-voltage battery, and is thus electrically connected to the negative electrode terminal of the drive power supply circuit 120 and the emitter of the IGBT 110d via the ground terminal for the high-voltage battery. A drain of the turn-off drive FET 122a is electrically connected to the gate of the IGBT 110d via the turn-off drive resistor 122b. A gate of the turn-off drive FET 122a is electrically connected to the control circuit 128.

The off-state holding circuit 123 is responsible for holding an off-state of the IGBT 110d. More specifically, when the gate voltage of the IGBT 110d becomes equal to or lower than an off-state holding threshold that is lower than the turn-on/off threshold for turning on and off the IGBT 110d, the off-state holding circuit 123 more rapidly discharges the gate of the IGBT 110d than the turn-off drive circuit 122 to decrease the gate voltage of the IGBT 110d below the turn-on/off threshold for turning on and off the IGBT 110d, thereby holding the off-state of the IGBT 110*d*. The off-state holding circuit 123 includes an off-state holding FET 123*a* and a gate resistor 123*b*.

The off-state holding FET 123*a*, which is N-channel MOSFET in the present embodiment, is turned on to discharge the gate of the IGBT 110*d*. A source of the off-state holding FET 123*a* is grounded via the ground terminal for the high-voltage battery, and is thus electrically connected to the negative electrode terminal of the drive power supply circuit 120 and the emitter of the IGBT 110*d* via the ground terminal for the high-voltage battery. A drain of the off-state holding FET 123*a* is electrically connected to the gate of the IGBT 110*d* via the turn-off drive resistor 122*b*. A gate of off-state holding FET 123*a* is electrically connected to the control circuit 128.

The cut-off circuit 124 is responsible for turning off the IGBT 110*d* when an abnormal current flows through the IGBT 110*d*. More specifically, when an overcurrent or a short-circuit current flows through the IGBT 110*d*, the cut-off circuit 124 more gradually discharges the gate of the IGBT 110*d* to decrease the gate voltage of the IGBT 110*d* below the turn-on/off threshold for turning on and off the IGBT 110*d*, thereby turning off the IGBT 110*d*. The cut-off circuit 124 includes a cut-off FET 124*a* and a cut-off resistor 124*b*.

The cut-off FET 124*a*, which is an N-channel MOSFET in the present embodiment, is turned on to discharge the gate of the IGBT 110*d*. A source of the cut-off FET 124*a* is grounded via the ground terminal for the high-voltage battery, and is thus electrically connected to the negative electrode terminal of the drive power supply circuit 120 and the emitter of the IGBT 110*d* via the ground terminal for the high-voltage battery. A drain of the cut-off FET 124*a* is electrically connected to the gate of the IGBT 110*d* via the cut-off resistor 124*b*. A gate of the cut-off FET 124*a* is electrically connected to the control circuit 128.

The current detection circuit 125 is responsible for detecting whether or not there exists a current flowing through the IGBT 110*d*. More specifically, when a current flowing through the IGBT 110*d* exceeds a current threshold, the current detection circuit 125 determines that there exists an actual current flowing through the IGBT 110*d*. An input terminal of the current detection circuit 125 is electrically connected to one end of a current sense resistor 111*d*. An output terminal of the current detection circuit 125 is electrically connected to the control circuit 128.

The overcurrent detection circuit 126 is responsible for detecting whether or not there exists an overcurrent flowing through the IGBT 110*d*. More specifically, when a current flowing through the IGBT 110*d* exceeds an overcurrent threshold that is larger than the current threshold, the overcurrent detection circuit 126 determines that there exists an overcurrent flowing through the IGBT 110*d*. An input terminal of the overcurrent detection circuit 126 is electrically connected to the one end of the current sense resistor 111*d*. An output terminal of the overcurrent detection circuit 126 is electrically connected to the control circuit 128.

The short-circuit detection circuit 127 is responsible for detecting whether or not the IGBT 110*d* is short-circuited. More specifically, when a current flowing through the IGBT 110*d* exceeds a short-circuit current threshold that is larger than the overcurrent threshold due to both the IGBT 110*a* and IGBT 110*d* being in an on-state to thereby be short circuited, the short-circuit detection circuit 127 determines that there exists a short-circuit current flowing through the IGBT 110*d*. An input terminal of the short-circuit detection circuit 127 is electrically connected to the one end of the current sense resistor 111*d*. An output terminal of short-circuit detection circuit 127 is electrically connected to the control circuit 128.

As shown in FIG. 3, the current detection circuit 125 includes a comparator 125*a* and a reference power supply 125*b* for current detection. A voltage of the reference power supply 125*b* is set at a constant voltage corresponding to the current threshold. A non-inverting input terminal of the comparator 125*a* is electrically connected to the current sense resistor 111*d*, and an inverting input terminal of the comparator 125*a* is electrically connected to a positive electrode terminal of the reference power supply 125*b*. A negative electrode terminal of the reference power supply 125*b* is grounded via the ground terminal for the high-voltage battery. An output terminal of the comparator 125*a* is electrically connected to the control circuit 128.

The overcurrent detection circuit 126 includes a comparator 126*a* and a reference power supply 126*b* for overcurrent detection. A voltage of the reference power supply 126*b* is set at a constant voltage corresponding to the overcurrent threshold. A non-inverting input terminal of the comparator 126*a* is electrically connected to the current sense resistor 111*d*, and an inverting input terminal of the comparator 126*a* is electrically connected to a positive electrode terminal of the reference power supply 126*b*. A negative electrode terminal of the reference power supply 126*b* is grounded via the ground terminal for the high-voltage battery, and an output terminal of the comparator 126*a* is electrically connected to the control circuit 128.

The short-circuit detection circuit 127 includes a comparator 127*a* and a reference power supply 127*b* for short-circuit detection. A voltage of the reference power supply 127*a* is set at a constant voltage corresponding to the short-circuit current threshold. A non-inverting input terminal of the comparator 127*a* is electrically connected to the current sense resistor 111*d*, and an inverting input terminal of the comparator 127*a* is electrically connected to a positive electrode terminal of the reference power supply 127*b*. A negative electrode terminal of the reference power supply 127*b* is grounded via the ground terminal for the high-voltage battery. An output terminal of the comparator 127*a* is electrically connected to the control circuit 128.

The control circuit 128 as shown in FIG. 2 controls the turn-on drive circuit 121 and the turn-off drive circuit 122 on the basis of the drive signal inputted from the external to drive the IGBT 110*d*, and controls the off-state holding circuit 123 on the basis of the gate voltage of the IGBT 110*d* to hold the off-state of the IGBT 110*d*. In addition, when the control IGBT 110*d* is unable to be turned off, the control circuit 128 deactivates the drive power supply circuit 120, thereby turning off the IGBT 110*d*. When the overcurrent and/or short-circuit current flow through the IGBT 110*d*, the control circuit 128 controls the cut-off circuit 124 to turn off the IGBT 110*d*. The control circuit 128 is electrically connected to the gate of the turn-on drive FET 121*a* and the gate of the turn-off drive FET 122*a*. The control circuit 128 is electrically connected to the gate of the IGBT 110*d* to detect the gate voltage of the IGBT 110*d*, and is electrically connected to the gate of the off-state holding FET 123*a* via the gate resistor 123*b*, and further to the control terminal of the drive power supply circuit 120. In addition, the control circuit 128 is electrically connected to the output terminals of the current detection circuit 125, the overcurrent detection circuit 126 and the short-circuit detection circuit 127, as well as to the gate of the cut-off FET 124*a*.

In the present embodiment, the drive power supply circuit 120, the turn-on drive FET 120*a*, the turn-off drive FET 122*a*, the cut-off FET 124*a*, the current detection circuit 125, the overcurrent detection circuit 126, the short-circuit detection circuit 127, and the control circuit 128 may be integrated into an integrated circuit (IC).

There will now be explained an operation of the motor control device with reference to FIG. 1. When a vehicular ignition switch (not shown) is turned on, the motor control device 1 as shown in FIG. 1 is activated. A DC high voltage of the high-voltage battery B1 is smoothed by the smoothing capacitor 10. The controller 12 controls the IGBT 110a-110f included in the inverter 11 on the basis of the drive signal inputted from the external. The inverter 11 converts the DC high voltage smoothed by the smoothing capacitor 10 into a three-phase AC voltage, and supplies the three-phase AC voltage to the vehicle drive motor M1. The motor control device 1 controls the vehicle drive motor M1 in this way.

There will now be explained with reference to FIG. 2 and FIG. 3 how the IGBT 110d is driven to operate by the control circuit 128, particularly, in an abnormal state such that the IGBT 110d is unable to be turned off. As shown in FIG. 2, the control circuit 128 controls the turn-on drive FET 121a and the turn-off drive FET 122a on the basis of the drive signal inputted from the external to drive the IGBT 110d.

When the drive signal instructs turn-on of the IGBT 110d, the control circuit 128 turns on the turn-on drive FET 121a and turns off the turn-off drive FET 122a, which leads to the gate of the IGBT 110d being charged by the drive power supply circuit 120 via the turn-on drive resistor 121b. Accordingly, the gate voltage of the IGBT 110d is increased higher than the turn-on/off threshold for turning on and off the IGBT 110d, and then the IGBT 110d is turned on.

On the other hand, when the drive signal instructs turn-off of the IGBT 110d, the control circuit 128 turns off the turn-on drive FET 121a and turns on the turn-off drive FET 122a, which leads to the gate of the IGBT 110d being discharged via the turn-off drive resistor 122b. Accordingly, the gate voltage of the IGBT 110d is decreased lower than the turn-on/off threshold for turning on and off the IGBT 110d, and then the IGBT 110d is turned off.

When the gate voltage of the IGBT 110d is further decreased equal to or lower than the off-state holding threshold that is lower than the turn-on/off threshold for turning on and off the IGBT 110d, the control circuit 128 turns on the off-state holding FET 123a, which leads to the gate of the IGBT 110d being further discharged via the off-state holding resistor 123b. This allowed the IGBT 110d to be kept in the off-state.

When a current flowing through the IGBT 110d becomes larger than the current threshold, the current detection circuit 125 determines that there exists an actual current flowing through the IGBT 110d. In cases where the control circuit 128 determines from the detection of the current detection circuit 125 that there exists an actual current flowing through the IGBT 110d in spite of the drive signal instructing turn-off of the IGBT 110d, the control circuit 128 determines that the IGBT 110d is in an abnormal state such that the IGBT 110d is unable to be turned off. In response, the control circuit 128 deactivates the drive power supply circuit 120 to cut off supply of voltage from the drive power supply circuit 120. Accordingly, the gate voltage becomes lower than the turn-on/off threshold for turning on and off the IGBT 110d, and the IGBT 110d is thus turned off.

When the current flowing through the IGBT 110d increases to become larger than the overcurrent threshold, the overcurrent detection circuit 126 determines that there exists an overcurrent flowing through the IGBT 110d. In cases where the overcurrent detection circuit 126 detects that there exists an overcurrent flowing through the IGBT 110d, the control circuit 128 turns on the cut-off FET 124a in response to the detection of the overcurrent detection circuit 126, which leads to the gate of the IGBT 110d being discharged via the cut-off resistor 124b. Accordingly, the gate voltage of the IGBT 110d is more gradually lowered below the turn-on/off threshold by the cut-off circuit 124 than by the turn-off drive circuit 122, and then the IGBT 110d is turned off.

When the current flowing through the IGBT 110d further increases to become larger than the short-circuit current threshold, the short-circuit detection circuit 127 determines that the IGBTs 110a, 110d are both in an on-state to be short-circuited. Also, in cases where the short-circuit detection circuit 127 detects that the IGBTs 110a, 110d are short-circuited, the control circuit 128 turns on the cut-off FET 124a in response to the detection of the short-circuit detection circuit 127, thereby turning off the IGBT 110d.

In summary of the first embodiment of the present invention, in cases where there exists a current flowing through the IGBT 110d in spite of the drive signal instructing turn-off of the IGBT 110d, the control circuit 128 determines that the IGBT 110d is in an abnormal state such that the IGBT 110d is unable to be turned off. Therefore, according to the present embodiment, it is possible to detect such an abnormality.

Further in the first embodiment, in cases where the control circuit 128 determines that the IGBT 110d is in an abnormal state such that the IGBT 110d is unable to be turned off in spite of the drive signal instructing turn off of the IGBT 110d, the control circuit 128 deactivates the drive power supply circuit 120 to cut off its supply of voltage to the IGBT 110d. Accordingly, the gate voltage of the IGBT 110d decreases lower than the turn-on/off threshold for turning on and off the IGBT 110d, and then IGBT 110d is turned off. This may prevent thermal destruction of the IGBT 110d.

Still further in the first embodiment, in cases where a current flowing through the IGBT 110d becomes larger than the current threshold, the current detection circuit 125 determines that there exists an actual current flowing through the IGBT 110d. This leads to reliable detection of such an actual current flowing through the IGBT 110d.

In the first embodiment, in cases where the control circuit 128 determines on the basis of the detection of the current detection circuit 125 that the IGBT 110d is in an abnormal state such that the IGBT 110d is unable to be turned off in spite of the drive signal instructing turn-off of the IGBT 110d, then the control circuit 128 deactivates the drive power supply circuit 120 to cut off its supply of voltage to the IGBT 110d, thereby turning off the IGBT 110d.

Alternatively, in cases where the IGBT 110d is in such an abnormal state, the control circuit 128 may control the turn-off drive FET 122a and/or the off-state holding FET 123a to turn off the IGBT 110d. For example, when the abnormal state is due to a failure occurring in a portion of the control circuit 128 for activating the turn-off drive FET 122a in response to the drive signal instructing turn-off of the IGBT 110d, and there is provided a backup portion of the control circuit 128 for activating the turn-off drive FET 122a and/or the off-state holding FET 123a when it is determined that the IGBT 110d is in an abnormal state such that the IGBT 110d is unable to be turned off, the control circuit 128 can control the turn-off drive FET 122a and/or the off-state holding FET 123a to turn off the IGBT 110d even in the abnormal state. Such turn-on of the turn-off drive FET 122a and/or the off-state holding FET 123a leads to discharging of the gate of the IGBT 110d, which then leads to turn-off of the IGBT 110d. This may prevent thermal destruction of the IGBT 110d.

Alternatively, the IGBT 110d may be turned on. Once the IGBT 110a as shown in FIG. 2 is turned on, the IGBT 110a, 110d, which are electrically connected in series, are both activated, which results in a short-circuit current following through the IGBTs 110a, 110d. The short-circuit current flowing through the IGBT 110a triggers the control circuit that controls the IGBT 110a to turn off the IGBT 110a in a similar manner as described above regarding the IGBT 110d. Accordingly, the short-circuit current is cut off. This may prevent thermal destruction of the IGBT 110d.

Further in the first embodiment, a voltage of the reference power supply for current detection 125b is set at a constant voltage. That is, the current threshold takes a constant value. Alternatively, the voltage of the reference power supply for current detection 125b may be regulated as a function of a temperature of the IGBT. The current that flows through the IGBT may vary with its temperature even if the other control conditions are same. Therefore, whether or not there exists a current flowing through the IGBT can be securely detected without being adversely affected by the variation in temperature by regulating the current threshold as a function of the temperature. This may enhance detection accuracy of the current detection circuit 125.

Second Embodiment

There will now be explained a motor control device in accordance with a second embodiment of the present invention. In the motor control device of the second embodiment, the current detection circuit and the overcurrent detection circuit share a comparator, while in the motor control device of the first embodiment, the current detection circuit, the overcurrent detection circuit, and the short-circuit detection circuit are separate circuits.

Figure 4A:
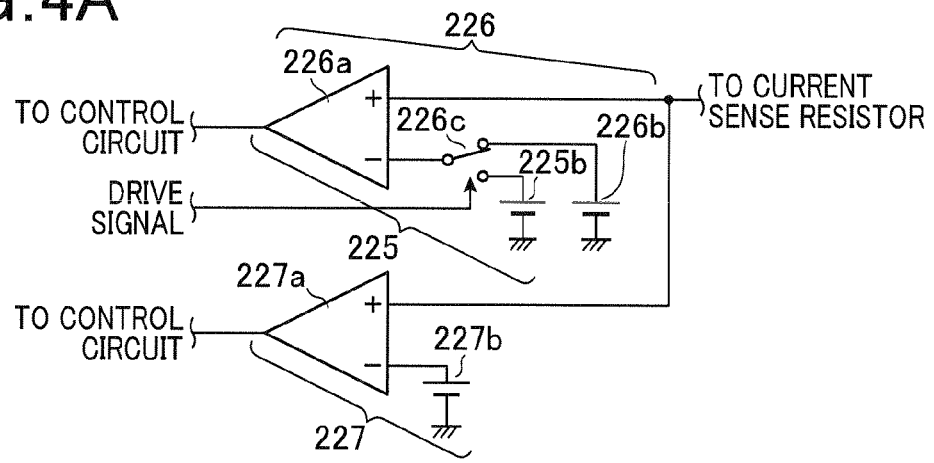
FIG. 4A schematically illustrates a circuit diagram of a current detection circuit, an overcurrent detection circuit and a short-circuit detection circuit in accordance with a second embodiment of the present invention.

FIG. 4A shows a circuit diagram of the current detection circuit, the overcurrent detection circuit, and the short-circuit detection circuit in accordance with the second embodiment. Only differences will be described between the first and second embodiments.

As shown in FIG. 4A, the overcurrent detection circuit 226 includes a comparator 226a, a reference power supply for overcurrent detection 226b, and a reference power supply selector switch 226c. A non-inverting input terminal of the comparator 226a is electrically connected to the current sense resistor, and an inverting input terminal of the comparator 226a is electrically connected to one end of the reference power supply selector switch 226c. One of the other two ends of the reference power supply selector switch 226c is electrically connected to a positive electrode terminal of the reference power supply for overcurrent detection 226b, a negative electrode terminal of which is grounded. The other one of the other two ends of the reference power supply selector switch 226c is electrically connected to a positive electrode terminal of the reference power supply for current detection 225b that is an element of the current detection circuit 225. A negative electrode terminal of the reference power supply for current detection 225b is grounded. An output terminal of the comparator 226a is electrically connected to the control circuit 228.

On the other hand, the current detection circuit 225 includes the comparator 226a that is shared with the overcurrent detection circuit 226, the reference power supply for current detection 225b, and the reference power supply selector switch 226c that is shared with the overcurrent detection circuit 226. With this configuration, the overcurrent detection circuit can be changed to the current detection circuit 225 through the reference power supply selector switch 226c switching from the reference power supply for overcurrent detection 226b to the reference power supply for current detection 225b.

The short-circuit detection circuit 227 includes a comparator 227a and a reference power supply for short-circuit detection 227b. The comparator 227a and the reference power supply for short-circuit detection 227b are identical to the comparator 127a and the reference power supply for short-circuit detection 127b of the first embodiment, respectively.

There will now be explained how the current detection circuit and the overcurrent detection circuit of the second embodiment operate with reference to FIG. 4A. Upon turn-off instruction of the drive signal for the IGBT, the reference power supply selector switch 226c switches from the reference power supply for overcurrent detection 226b to the reference power supply for current detection 225b. Subsequently, the reference power supply selector switch 226c switches from the reference power supply for current detection 225b to the reference power supply for overcurrent detection 226b at timing when the drive signal instructs turn-on of the IGBT. During the drive signal instructing turn-off of the IGBT, the control circuit regards an output of the comparator 226a as an output of the current detection circuit 225, and determines whether or not there exists a current flowing through the IGBT. On the other hand, during the drive signal instructing turn-on of the IGBT, the control circuit regards an output of the comparator 226a as an output of the overcurrent detection circuit 226, and determines whether or not there exists an overcurrent flowing through the IGBT.

In the second embodiment, the overcurrent detection circuit 226 and the current detection circuit 225 are sharing a comparator, which leads to circuit simplification.

Further in the second embodiment, it is possible to reliably determine whether or not there exists a current flowing through the IGBT while the drive signal is instructing turn-off of the IGBT.

(Modifications)

In the second embodiment, the overcurrent detection circuit 226 is changed to the current detection circuit 225 through the reference power supply selector switch 226c switching from the reference power supply for overcurrent detection 226b to the reference power supply for current detection 225b, and vice versa.

Figure 4B:
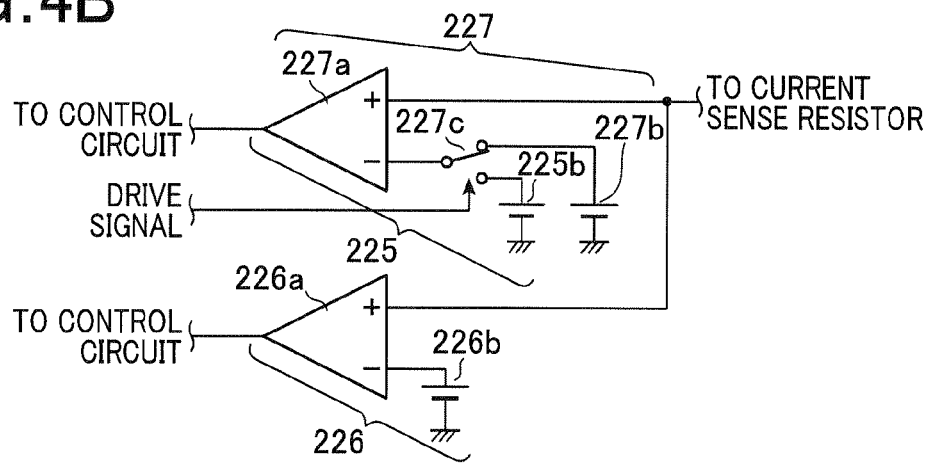
FIG. 4B schematically illustrates an alternative circuit diagram of a current detection circuit, an overcurrent detection circuit and a short-circuit detection circuit in accordance with the second embodiment of the present invention.

Alternatively, as shown in FIG. 4B, the current detection circuit 225 and the short-circuit detection circuit 227 may share en element, i.e., a comparator 227a. With this configuration, the short-circuit detection circuit 227 may be changed to the current detection circuit 225 through the reference power supply selector switch 227c switching from the reference power supply for short-circuit detection 227b to the reference power supply for current detection 225b, and vice versa. This also leads to circuit simplification.

Still further in the second embodiment, as shown in FIG. 4A, the reference power supply selector switch 226c is switched from the reference power supply for overcurrent detection 226b to the reference power supply for current detection 225b at timing when the drive signal instructs turn-off of the IGBT.

Alternatively, the reference power supply selector switch 226c may be switched from the reference power supply for overcurrent detection 226b to the reference power supply for current detection 225b at timing when the control circuit turns on the turn-off drive FET to regulate the gate voltage of the IGBT in response to the drive signal instructing turn-off of the IGBT. In practice, the timing when the control circuit turns on the turn-off drive FET to regulate the gate voltage of the IGBT is delayed from the timing when the drive signal instructs turn-off of the IGBT. Therefore, the reference power supply selector switch 226c being switched from the reference power supply for overcurrent detection 226b to the reference power supply for current detection 225b at timing when the control circuit turns on the turn-off drive FET to regulate the gate voltage of the IGBT, may lead to reliable determination of whether or not there exists a current flowing through the IGBT without being adversely affected by the circuit delay. This may thus prevent false detection due to the circuit delay.

Third Embodiment

There will now be explained a motor control device in accordance with a third embodiment of the present invention. In the third embodiment, once an abnormality is detected in the IGBT, the motor control device of the third embodiment clamps the gate voltage of the IGBT at a voltage equal to or lower than the off-state holding threshold for the off-state holding circuit to turn off the IGBT, while the motor control device of the first embodiment cuts off supply of voltage from the drive power supply circuit to turn off the IGBT. The motor control device of the third embodiment is identical to the motor control device of the first embodiment, except for its controller.

Figure 5:
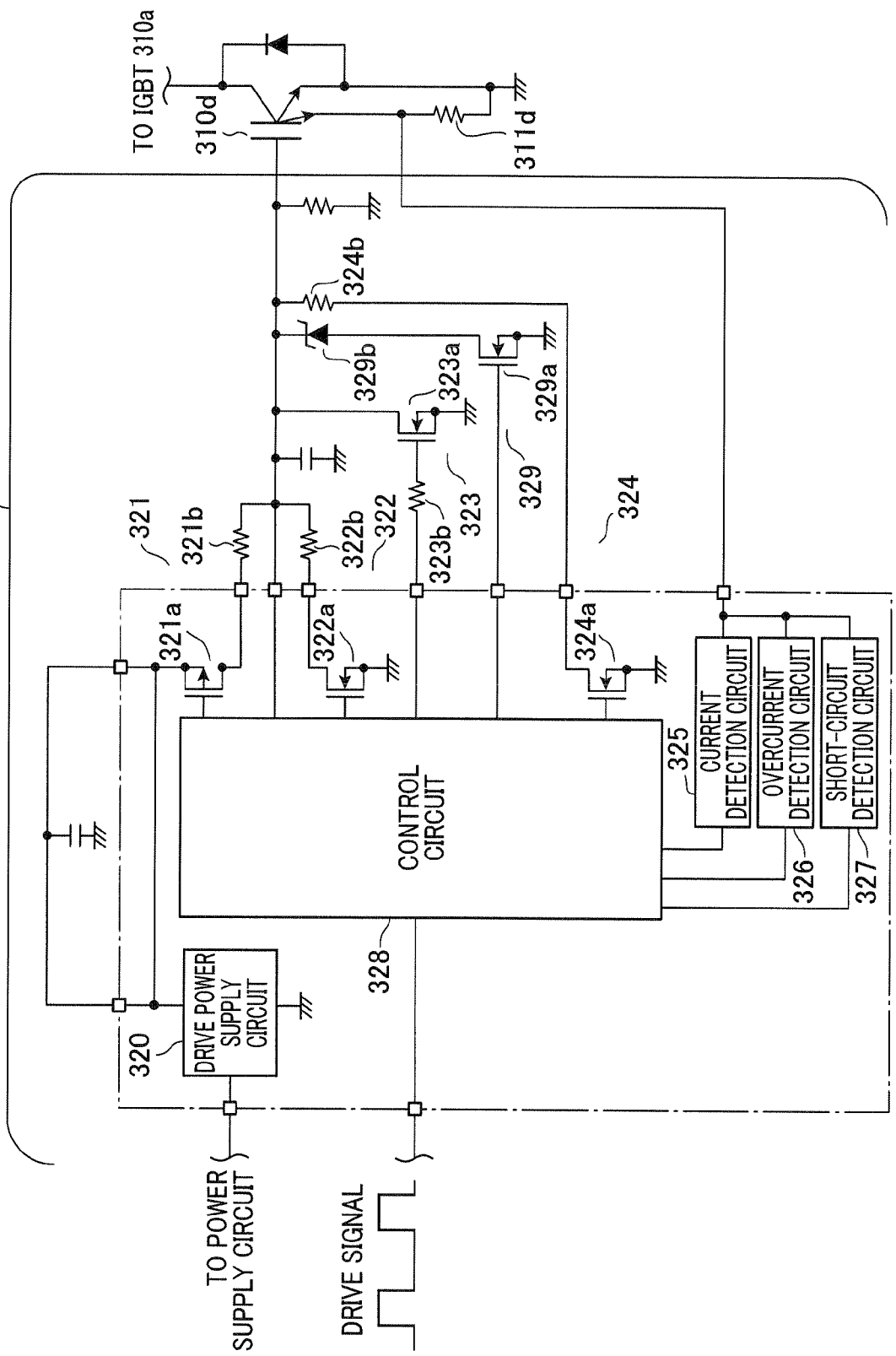
FIG. 5 schematically illustrates a circuit diagram of a controller in accordance with a third embodiment of the present invention.

FIG. 5 shows a circuit diagram of the controller in accordance with the third embodiment of the present invention. Only differences will be described herein between the controllers of the first and third embodiments.

As shown in FIG. 5, the controller 32 includes a drive power supply circuit 320, a turn-on drive circuit 321, a turn-off drive circuit 322, an off-state holding circuit 323, a cut-off circuit 324, a current detection circuit 325, an overcurrent detection circuit 326, a short-circuit detection circuit 327, a control circuit 328, for the IGBT 310d. In the third embodiment, the controller 32 further includes a voltage clamp circuit 329. The IGBT 310d and a current sense resistor 311d correspond to the IGBT 110d and the current sense resistor 111d of first embodiment, respectively. The drive power supply circuit 320, the turn-on drive circuit 321, the turn-off drive circuit 322, the off-state holding circuit 323, the cut-off circuit 324, the current detection circuit 325, the overcurrent detection circuit 326, and the short-circuit detection circuit 327 are identical to the drive power supply circuit 120, the turn-on drive circuit 121, the turn-off drive circuit 122, the off-state holding circuit 123, the cut-off circuit 124, the current detection circuit 125, the overcurrent detection circuit 126, and the short-circuit detection circuit 127 of the first embodiment, respectively.

The voltage clamp circuit 329 is operative to clamp a gate voltage of the IGBT 310d at a voltage equal to or lower than the off-state holding threshold. The voltage clamp circuit 329 includes a voltage-clamp FET 329a and a constant voltage diode 329b. A voltage of the constant voltage diode 329b is set at a constant voltage that is equal to or lower than the off-state holding threshold. The voltage-clamp FET 329a, which is an N-channel MOSFET in the present embodiment, is turned on for thereby connecting the gate of the IGBT 320d to the constant voltage diode 329b. A source of the voltage-clamp FET 329a is grounded via a ground terminal for the high-voltage battery insulated from the vehicle body, and is thus electrically connected to a negative electrode terminal of the drive power supply circuit 320 and an emitter of the IGBT 310d via the ground terminal for the high-voltage battery. A drain of the voltage-clamp FET 329a is electrically connected to the gate of the IGBT 320d via the constant voltage diode 329b. More specifically, the drain of the voltage-clamp FET 329a is electrically connected to an anode of the constant voltage diode 329b, and a cathode of the constant voltage diode 329b is electrically connected to the gate of the IGBT 320d. Further, a gate of the voltage-clamp FET 329a is electrically connected to the control circuit 328.

There will now be explained with reference to FIG. 5 how the IGBT will operate when it is determined that the IGBT is in an abnormal state. When a current flowing through the IGBT 310d becomes larger than the current threshold, the current detection circuit 325 determines that there exists an actual current flowing through the IGBT 310d. In cases where the control circuit 328 determines on the basis of the detection of the current detection circuit 325 that there exists an actual current following through the IGBT 310d in spite of the drive signal instructing turn-off of the IGBT 310d, the control circuit 328 determines that the IGBT 310d is in an abnormal state such that the IGBT 310d is unable to be turned off. The control circuit 328 then triggers the voltage clamp circuit 329 to clamp the gate voltage of the IGBT 310d at a voltage equal to or lower than the off-state holding threshold. More specifically, the control circuit 328 turns on the voltage-clamp FET 329a to clamp the gate voltage of the IGBT 310d at a voltage set by the constant voltage diode 329b to be equal to or lower than the off-state holding threshold. Accordingly, the off-state holding FET 323a is turned on, and then the gate of the IGBT 310d is discharged, which leads to the IGBT 310d being turned off.

In summary of the third embodiment, in cases where the control circuit 328 determines that the IGBT 310d is in the abnormal state, the control circuit 328 triggers the voltage clamp circuit 329 to clamp the gate voltage of the IGBT 310d at a voltage equal to or lower than the off-state holding threshold. Accordingly, the off-state holding FET 323a is turned on, and then the gate of the IGBT 310d is discharged, which leads to the IGBT 310d being turned off. This may prevent thermal destruction of the IGBT 310d.

Fourth Embodiment

There will now be explained a motor control device in accordance with a fourth embodiment of the present invention. In the fourth embodiment, once an abnormality is detected in the IGBT, the motor control device of the fourth embodiment insulates the turn-on drive FET and the turn-off drive FET from the gate of the IGBT, while the motor control device of the first embodiment cuts off supply of voltage from the drive power supply circuit to turn off the IGBT. The motor control device of the fourth embodiment is identical to the motor control device of the first embodiment, except for its controller.

Figure 6:
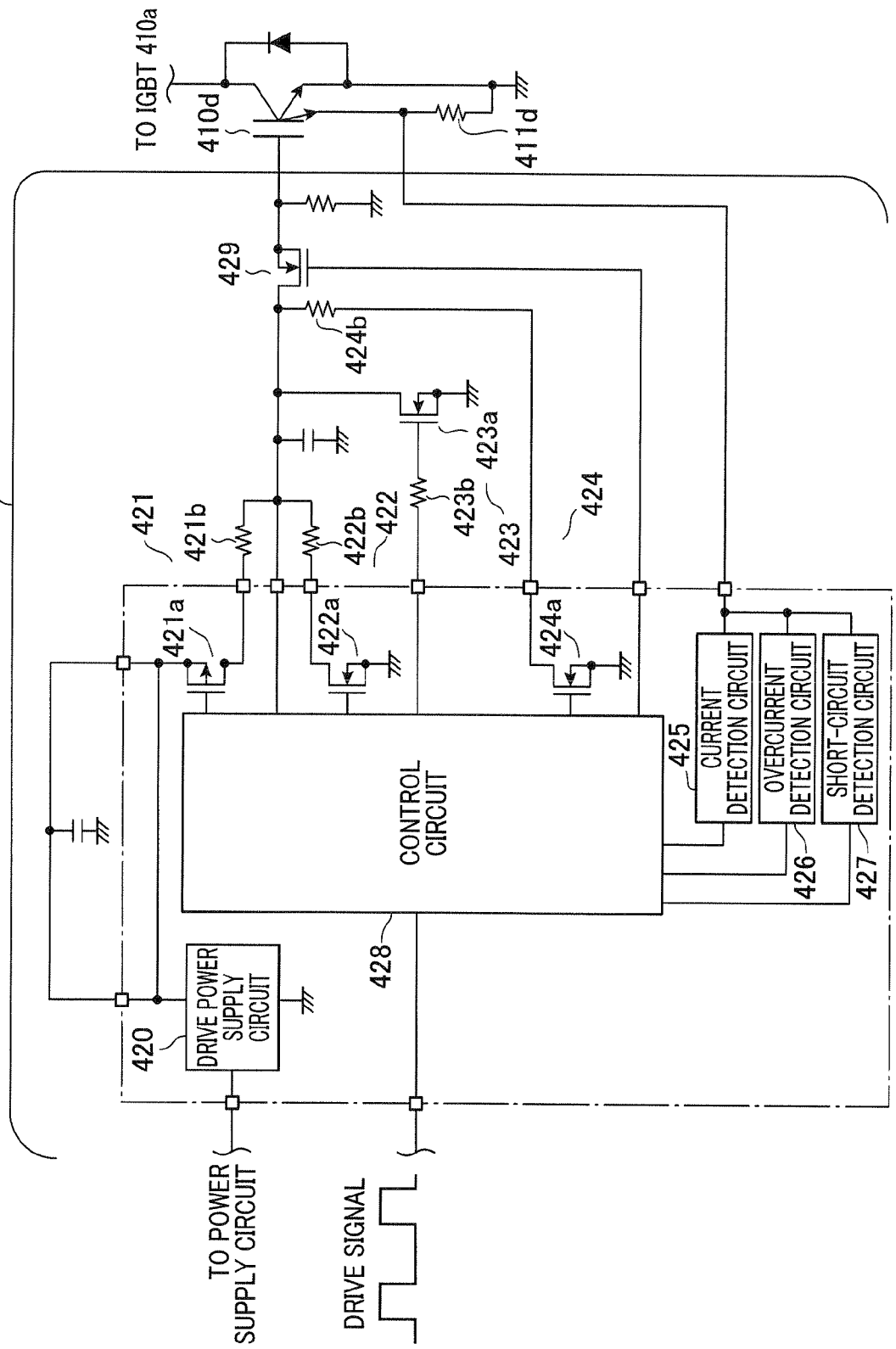
FIG. 6 schematically illustrates a circuit diagram of a controller in accordance with a fourth embodiment of the present invention.

There will now be explained the controller with reference to FIG. 6. FIG. 6 shows a circuit diagram of the controller of the fourth embodiment. Only differences will be described herein between the controllers of the first and fourth embodiments.

As shown in FIG. 6, the controller 42 includes a drive power supply circuit 420, a turn-on drive circuit 421, a turn-off drive circuit 422, an off-state holding circuit 423, a cut-off circuit 424, a current detection circuit 425, an overcurrent detection circuit 426, a short-circuit detection circuit 427, and a control circuit 428, for the IGBT 410d. The controller 42 further includes a gate-insulating FET 429. The IGBT 410d and the current sense resistor 411d correspond to the IGBT 110d and the current sense resistor 111d of the first embodiment, respectively. The drive power supply circuit 420, the turn-on drive circuit 421, the turn-off drive circuit 422, the off-state holding circuit 423, the cut-off circuit 424, the current detection circuit 425, the overcurrent detection circuit 426, and the short-circuit detection circuit 427 are identical to the drive power supply circuit 120, the turn-on drive circuit 121, the turn-off drive circuit 122, the off-state holding circuit 123, the cut-off circuit 124, the current detection circuit 125, the overcurrent detection circuit 126, and the short-circuit detection circuit 127 of the first embodiment, respectively.

The gate-insulating FET 429, which is N-channel MOSFET, is operative to insulate the gate of the IGBT 410d from the turn-on drive FET 421a and the turn-off drive FET 422a. A source of the gate-insulating FET 429 is electrically connected to the gate of the IGBT 410d. A drain of the gate-insulating FET 429 is electrically connected to the turn-on drive FET 421a via the turn-on drive resistor 421b and to the turn-off drive FET 422a via the turn-off drive resistor 422b. A gate of the gate-insulating FET 429 is electrically connected to the control circuit 428.

There will now be explained with reference to FIG. 6 how the IGBT will operate when it is determined that the IGBT is in the abnormal state. When a current flowing through the IGBT 410d becomes larger than the current threshold, the current detection circuit 425 determines that there exists an actual current flowing through the IGBT 410d. In cases where the control circuit 428 determines on the basis of the detection of the current detection circuit 425 that there exists an actual current following through the IGBT 410d in spite of the drive signal instructing turn-off of the IGBT 410d, the control circuit 428 determines that the IGBT 410d is in an abnormal state such that the IGBT 410d is unable to be turned off. The control circuit 428 then electrically insulates (or isolate) the gate of the IGBT 410d from the turn-on drive FET 421a and the turn-off drive FET 422a. Accordingly, supply of voltage from the drive power supply circuit 420 to the IGBT 410d is cut off, which leads to the IGBT 410d being turned off.

In summary of the fourth embodiment, in cases where the control circuit 428 determines that the IGBT 410d is in the abnormal state, the control circuit 428 insulates the gate of the IGBT 410d from the turn-on drive FET 421a and the turn-off drive FET 422a so that the supply of voltage from the drive power supply circuit 420 to the IGBT 410d is cut off, thereby turning off the IGBT 410d. This may prevent thermal destruction of the IGBT 410d.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An electronic device comprising:
   a first switching element that is driven by controlling a voltage on its control terminal; and
   a first drive circuit that controls the voltage on the control terminal of the first switching element on the basis of an inputted drive signal to drive the first switching element;
   wherein in cases where there exists a current flowing through the first switching element in spite of the drive signal instructing turn-off of the first switching element, the first drive circuit determines that the first switching element is in an abnormal state.

2. The device of claim 1, further comprising a drive power supply circuit that supplies a voltage for driving the first switching element,
   wherein in cases where the first drive circuit determines that the first switching element is in the abnormal state, the first drive circuit cuts off the supply of voltage from the drive power supply circuit to the control terminal of the first switching element to thereby turn off the first switching element.

3. The device of claim 1, further comprising a turn-on drive switching element that is electrically connected to the control terminal of the first switching element, the turn-on drive switching element being operative to, when turned on, charge the control terminal of the first switching element,
   wherein when the inputted drive signal instructs turn-on of the first switching element, the first drive circuit controls the turn-on drive switching element to turn on the first switching element.

4. The device of claim 1, further comprising a turn-off drive switching element that is electrically connected to the control terminal of the first switching element, the turn-off drive switching element being operative to, when turned on, discharge the control terminal of the first switching element,
   wherein when the inputted drive signal instructs turn-off of the first switching element, the first drive circuit controls the turn-off drive switching element to turn off the first switching element.

5. The device of claim 4, wherein in cases where the first drive circuit determines that the first switching element is in the abnormal state, the first drive circuit controls the turn-off drive switching element to turn off the first switching element.

6. The device of claim 1, further comprising an off-state holding switching element that is electrically connected to the control terminal of the first switching element, the off-state holding switching element being operative to, when turned on, discharge the control terminal of the first switching element,
   wherein when the voltage on the control terminal of the first switching element becomes equal to or lower than an off-state holding threshold that is lower than a turn-on/off threshold for turning on and off the first switching element, the first drive circuit controls the off-state holding switching element to hold an off-state of the first switching element.

7. The device of claim 6, wherein in cases where the first drive circuit determines that the first switching element is in the abnormal state, the first drive circuit controls the off-state holding switching element to turn off the first switching element.

8. The device of claim 6, further comprising a voltage clamp circuit that clamps the voltage on the control terminal of the first switching element at a voltage that is equal to or lower than the off-state holding threshold,
   wherein in cases where the first drive circuit determines that the first switching element is in the abnormal state, the first drive circuit triggers the voltage clamp circuit to clamp the voltage on the control terminal of the first switching element at the voltage that is equal to or lower than the off-state holding threshold to thereby turn off the first switching element via the off-state holding switching element.

9. The device of claim 1, further comprising:
   a second switching element that is electrically connected in series with the first switching element, the second switching element being driven by controlling a voltage on its control terminal; and
   a second drive circuit that controls the voltage on the control terminal of the second switching element to drive the second switching element on the basis on an inputted drive signal, the second drive circuit being operative to, in cases where there exists an abnormal current flowing through the second switching element, turn off the second switching element, wherein in cases where the first drive circuit determines that the first switching element is in the abnormal state, the first drive circuit turns on the first switching element.

10. The device of claim 1, wherein in cases where the first drive circuit determines that the first switching element is in the abnormal state, the first drive circuit electrically insulates the control terminal of the first switching element from the first drive circuit.

11. The device of claim 2, further comprising a current detection circuit that, when a current flowing through the first switching element becomes larger than a current threshold, determines that there exists an actual current flowing through the first switching element, wherein in cases where the first drive circuit determines on the basis of the detection of the current detection circuit that there exists the actual current flowing through the first switching element in spite of the drive signal instructing turn-off of the first switching element, the first drive circuit determines that the first switching element is in the abnormal state, and then cuts off the supply of voltage from the drive power supply circuit to the control terminal of the first switching element to thereby turn off the first switching element.

12. The device of claim 4, further comprising a current detection circuit that, when a current flowing through the first switching element becomes larger than a current threshold, determines that there exists an actual current flowing through the first switching element, wherein in cases where the first drive circuit determines on the basis of the detection of the current detection circuit that there exists the actual current flowing through the first switching element in spite of the drive signal instructing turn-off of the first switching element, the first drive circuit determines that the first switching element is in the abnormal state, and then controls the turn-off drive switching element to turn off the first switching element.

13. The device of claim 8, further comprising a current detection circuit that, when a current flowing through the first switching element becomes larger than a current threshold, determines that there exists an actual current flowing through the first switching element, wherein in cases where the first drive circuit determines on the basis of the detection of the current detection circuit that there exists the actual current flowing through the first switching element in spite of the drive signal instructing turn-off of the first switching element, the first drive circuit determines that the first switching element is in the abnormal state, and then the first drive circuit triggers the voltage clamp circuit to clamp the voltage on the control terminal of the first switching element at the voltage that is equal to or lower than the off-state holding threshold.

14. The device of claim 12, further comprising an overcurrent detection circuit that, when a current flowing through the first switching element becomes larger than an overcurrent threshold that is larger than the current threshold, determines that there exists an overcurrent flowing through the first switching element; and a cut-off circuit that is electrically connected to the control terminal of the first switching element, the cut-off circuit being operative to, when activated, discharge the control terminal of the first switching element more gradually than the turn-off drive switching element, wherein in cases where the first drive circuit determines on the basis of the detection of the overcurrent detection circuit that there exists the overcurrent flowing through the first switching element, the first drive circuit controls the cut-off circuit to turn off the first switching element.

15. The device of claim 12, further comprising an short-circuit current detection circuit that, when a current flowing through the first switching element becomes larger than an short-circuit current threshold that is larger than the current threshold, determines that there exists a short-circuit current flowing through the first switching element; and a cut-off circuit that is electrically connected to the control terminal of the first switching element, the cut-off circuit being operative to, when activated, discharge the control terminal of the first switching element more gradually than the turn-off drive switching element, wherein in cases where the first drive circuit determines on the basis of the detection of the short-circuit current detection circuit that there exists the short-circuit current flowing through the first switching element, the first drive circuit controls the cut-off circuit to turn off the first switching element.

16. The device of claim 2, further comprising a current detection and overcurrent detection switchable circuit that is switchable between a current detection circuit and an overcurrent detection circuit, the current detection circuit being operable to, when a current flowing through the first switching element becomes larger than a current threshold, determine that there exists an actual current flowing through the first switching element, the overcurrent detection circuit being operable to, when a current flowing through the first switching element becomes larger than an overcurrent threshold that is larger than the current threshold, determine that there exists an overcurrent flowing through the first switching element, and the current detection and overcurrent detection switchable circuit including a first threshold selector switch that selects and switches to either one of the current threshold and the overcurrent threshold on the basis of instruction of the drive signal, and being operative to perform current detection on the basis of a threshold selected by the first threshold selector switch, wherein the current detection and overcurrent detection switchable circuit switches to the current detection circuit through the first threshold selector switch selecting and switching to the current threshold, and the current detection and overcurrent detection switchable circuit switches to the overcurrent detection circuit through the first threshold selector switch selecting and switching to the overcurrent threshold.

17. The device of claim 2, further comprising a current detection and short-circuit current detection switchable circuit that is switchable between a current detection circuit and a short-circuit current detection circuit, the current detection circuit being operable to, when a current flowing through the first switching element becomes larger than a current threshold, determine that there exists an actual current flowing through the first switching element, the short-circuit current detection circuit being operable to, when a current flowing through the first switching element becomes larger than an short-circuit current threshold that is larger than the current threshold, determine that there exists a short-circuit current flowing through the first switching element, and the current detection and short-circuit current detection switchable circuit including a second threshold selector switch that selects and switches to either one of the current threshold and the short-circuit current threshold on the basis of instruction of the drive signal, and being operative to perform current detection on the basis of a threshold selected by the second threshold selector switch, wherein the current detection and short-circuit current detection switchable circuit switches to the current detection circuit through the second threshold selector switch selecting and switching to the current threshold, and the current detection and short-circuit current detection switchable circuit switches to the short-circuit current detection circuit through the second threshold selector switch selecting and switching to the short-circuit current threshold.

18. The device of claim 16, wherein the first threshold selector switch selects and switches to the current threshold at timing when the drive signal instructs turn-off of the first switching element, wherein in cases where the first drive circuit determines on the basis of the detection of the current detection circuit that there exists the actual current flowing through the first switching element in spite of the drive signal instructing turn-off of the first switching element, the first drive circuit determines that the first switching element is in the abnormal state, and then cuts off the supply of voltage from the drive power supply circuit to the control terminal of the first switching element to thereby turn off the first switching element.

19. The device of claim 16, wherein the first threshold selector switch selects and switches to the current threshold at timing when the first drive circuit regulates the voltage on the control terminal of the first switching element in response to the drive signal instructing turn-off of the first switching element, wherein in cases where the first drive circuit determines on the basis of the detection of the current detection circuit that there exists the actual current flowing through the first switching element in spite of the drive signal instructing turn-off of the first switching element, the first drive circuit determines that the first switching element is in the abnormal state, and then cuts off the supply of voltage from the drive power supply circuit to the control terminal of the first switching element to thereby turn off the first switching element.

20. The device of claim 11, wherein the current threshold is regulated as a function of a temperature of the first switching element.

* * * * *